(12) United States Patent
Scherr (10) Patent No.: US 10,353,018 B2
(45) Date of Patent: Jul. 16, 2019

(54) HIGHLY EFFICIENT DIAGNOSTIC METHODS FOR MONOLITHIC SENSOR SYSTEMS

(71) Applicant: Infineon Technologies AG, Neubiberg (DE)

(72) Inventor: Wolfgang Scherr, Villach/Landskron (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/499,435

(22) Filed: Apr. 27, 2017

(65) Prior Publication Data
US 2017/0227614 A1    Aug. 10, 2017

Related U.S. Application Data

(62) Division of application No. 14/187,564, filed on Feb. 24, 2014, now Pat. No. 9,638,762.

(51) Int. Cl.
| | |
|---|---|
| *G01B 7/14* | (2006.01) |
| *G01B 7/30* | (2006.01) |
| *G01R 33/06* | (2006.01) |
| *G01R 33/00* | (2006.01) |
| *G01R 33/07* | (2006.01) |
| *G01R 33/09* | (2006.01) |
| *G01D 5/14* | (2006.01) |

(52) U.S. Cl.
CPC ....... *G01R 33/0023* (2013.01); *G01R 33/077* (2013.01); *G01R 33/093* (2013.01); *G01R 33/096* (2013.01); *G01R 33/098* (2013.01); *G01D 5/145* (2013.01)

(58) Field of Classification Search
CPC .................................................. G01R 33/023
USPC .......................................... 324/244, 750.01
See application file for complete search history.

(56) References Cited

U.S. PATENT DOCUMENTS

| | | |
|---|---|---|
| 6,225,802 B1 | 5/2001 | Ramalho et al. |
| 6,340,884 B1 | 1/2002 | Wolf et al. |
| 6,449,567 B1 | 9/2002 | Desai et al. |

(Continued)

FOREIGN PATENT DOCUMENTS

| | | |
|---|---|---|
| CN | 102402465 A | 4/2012 |
| CN | 102419403 A | 4/2012 |

(Continued)

OTHER PUBLICATIONS

Ramirez, Edgar C., Diverse redundancy used in SIS technology to achieve higher safety integrity, May 8, 2008.

(Continued)

*Primary Examiner* — Reena Aurora
(74) *Attorney, Agent, or Firm* — Schiff Hardin LLP (57) ABSTRACT

Embodiments relate to integrated circuit (IC) sensors and more particularly to IC sensor diagnostics using multiple (e.g., redundant) communication signal paths, wherein one or more of the communication signal paths can be diverse (e.g., in hardware, software or processing, an operating principle, or in some other way) from at least one other of the multiple communication signal paths. Embodiments can relate to a variety of sensor types, implementations and applications, including 3D magnetic field and other sensors.

20 Claims, 9 Drawing Sheets

(56) References Cited

U.S. PATENT DOCUMENTS

| | | | |
|---|---|---|---|
| 6,518,880 B2 * | 2/2003 | Tanizawa | G01L 9/045 |
| | | | 340/514 |
| 6,564,637 B1 | 5/2003 | Schalk et al. | |
| 6,704,682 B2 | 3/2004 | Summers et al. | |
| 7,042,208 B1 | 5/2006 | Harris | |
| 7,086,270 B2 | 8/2006 | Weinberg et al. | |
| 7,127,932 B2 | 10/2006 | Morell et al. | |
| 7,372,248 B2 | 5/2008 | Barthel et al. | |
| 7,855,562 B2 * | 12/2010 | Chiaburu | G01L 27/007 |
| | | | 324/537 |
| 8,359,182 B2 | 1/2013 | Niu et al. | |
| 9,346,441 B2 | 5/2016 | Rasbornig et al. | |
| 2002/0067255 A1 | 6/2002 | Tanizawa | |
| 2005/0124136 A1 | 6/2005 | Piguet et al. | |
| 2005/0216134 A1 | 9/2005 | Katrak et al. | |
| 2007/0247141 A1 | 10/2007 | Pastre et al. | |
| 2007/0260383 A1 | 11/2007 | Sundaram et al. | |
| 2007/0279044 A1 | 12/2007 | Rossmann et al. | |
| 2007/0282459 A1 | 12/2007 | Schafer et al. | |
| 2008/0012557 A1 | 1/2008 | Hammerschmidt | |
| 2008/0173518 A1 | 7/2008 | Klusemann | |
| 2008/0245145 A1 | 10/2008 | Mayer et al. | |
| 2009/0112418 A1 | 4/2009 | Buur et al. | |
| 2009/0128160 A1 | 5/2009 | Chiaburu et al. | |
| 2010/0097088 A1 | 4/2010 | Uemura | |
| 2010/0147124 A1 | 6/2010 | Seidel et al. | |
| 2012/0016623 A1 | 1/2012 | Hayner | |
| 2012/0074972 A1 | 3/2012 | Rasbornig et al. | |
| 2012/0249170 A1 | 10/2012 | Baumann et al. | |
| 2012/0262196 A1 | 10/2012 | Yokou | |
| 2013/0049780 A1 | 2/2013 | Collins, III et al. | |
| 2013/0076383 A1 | 3/2013 | Poinstingl et al. | |
| 2013/0200909 A1 | 8/2013 | Rasbornig et al. | |

FOREIGN PATENT DOCUMENTS

| | | |
|---|---|---|
| CN | 103389125 A | 11/2013 |
| WO | WO-2005/085892 A1 | 9/2005 |
| WO | WO-2005/083449 A3 | 10/2005 |

OTHER PUBLICATIONS

Pastre et al., "A Hall Sensor Analog Front End for Current Measurement with Continuous Gain Calibration," IEEE Sensors Journal, vol. 7, No. 5, May 2007, pp. 860-867.

National Instruments, What is the ISO 26262 Functional Safety Standard?, Published Feb. 23, 2012, as available at www.ni.com, 4 pages.

Dilger et al., On a redundant Diversified Steering Angle Sensor, © 2003, Proceedings of the 9th IEEE International On-Line Testing Symposium, 6 pages.

Torres-Echevernia et al., ScienceDirect, "Design Optimization of a Safety-Instrumented System Based on RAMS+C addressing IEC 61508 Requirements and Diverse Redundancy", 2009, Reliability Engineering & System Safety 94, pp. 162-179.

Suyama, Koichi, "Functional Safety Analysis of Reliable Control Systems Using Decision by Majority", Jun. 1999, Proceedings of the American Control Conference, pp. 618-621.

Endress + Hauser, FAQs about Functional Safety, © 2013, http://www.endress.com/eh/home.nsf/#products/~product-instrument-silfunctional-safety-faq-questions, 9 pages.

International Electrotechnical Commission, http://www.iec.ch/functionalsafety/faq-ed2, 9 pages, © 2014.

Wikipedia, ISO26262, available at http://en.wikipedia.org/wiki/ISO_26262 on Mar. 3, 2014. 6 pages.

Infineon, Innovative Semiconductor Solutions for Safety Applications, © 1999-2014, 4 pages.

* cited by examiner

HIGHLY EFFICIENT DIAGNOSTIC METHODS FOR MONOLITHIC SENSOR SYSTEMS

CROSS REFERENCE TO RELATED APPLICATIONS

This patent application is a divisional patent application of U.S. patent application Ser. No. 14/187,564, filed Feb. 24, 2014, entitled "HIGHLY EFFICIENT DIAGNOSTIC METHODS FOR MONOLITHIC SENSOR SYSTEMS," now U.S. Pat. No. 9,638,762, issued May 2, 2017, which is incorporated herein by reference in its entirety.

TECHNICAL FIELD

The invention relates generally to integrated circuit (IC) sensors and more particularly to IC sensor diagnostics using multiple communication signal paths.

BACKGROUND

A recent trend in automobile drive technology, as part of developments in the automobile electronics sector, is for established passive safety systems like seatbelts and airbags to be extended by active safety systems, such as anti-lock braking systems (ABS), electronic stability programs (ESP) and electrical steering systems, to provide an increasing range of driver assistance functionalities. As has already been the case in the drive train for some time, system complexity is also continuously increasing here in order to detect hazardous driving situations and contribute to accident avoidance through active interventions by a control system. With ongoing technological advances, these trends are expected to continue and grow stronger in the future.

The resulting significant increase in the number of electronic components with a safety-related functionality has given rise to previously unprecedented requirements in terms of reliability and system availability. In order to be able to achieve this while at the same time meeting cost objectives, it is desired to develop efficient methods for functional monitoring through integrated test methods along with designed redundancies. At the same time, progress is desired in design methodologies in order to be able to identify and avoid possible weaknesses in safety systems early on. In the area of magnetic field sensors, for example, this has been done by the introduction of the Safety Integrity Level (SIL) standard.

Figure 1A:
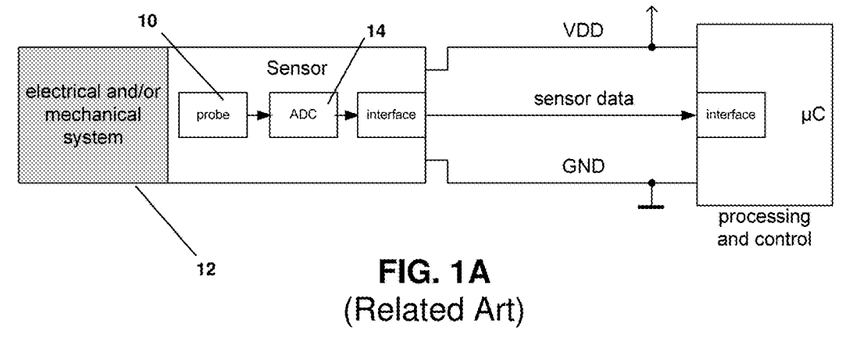
FIG. 1A is a block diagram of a conventional single path sensor system.

In order to meet SIL standards in the automotive field, it is desired to implement and use corresponding self-tests, including built-in tests, not only at start-up but also during normal operation, as well as automatic monitoring structures or corresponding redundant functional blocks and/or signal paths. Conventional magnetic sensor systems, such Hall-effect or magnetoresistive (xMR) systems, often have used a single-channel analog main signal path, such as the one depicted as an example in FIG. 1A in which the analog signals from a Hall sensor 10, measuring a magnetic property of a mechanical system 12, are passed through a single-channel path and via analog-to-digital converter (ADC) 14. It is technically very difficult, or perhaps even impossible, to meet the SIL requirements in safety-critical applications with this concept and therefore it is usually not possible to cover safety requirements with a single feed-forward sensor system.

Figure 1B:
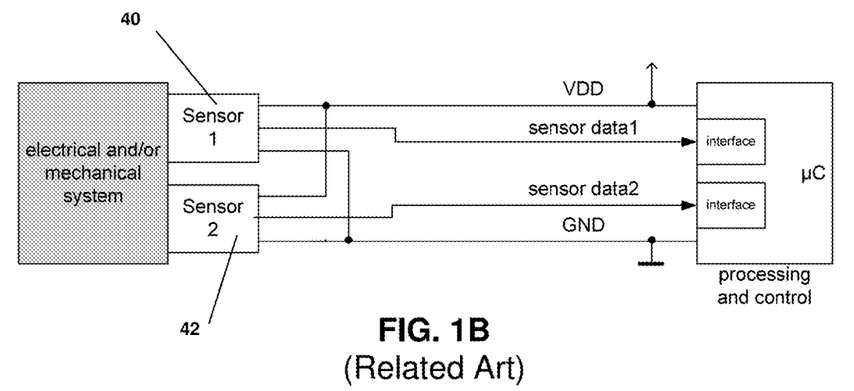
FIG. 1B is a block diagram of a conventional redundant sensor system comprising two sensors.
Figure 1C:
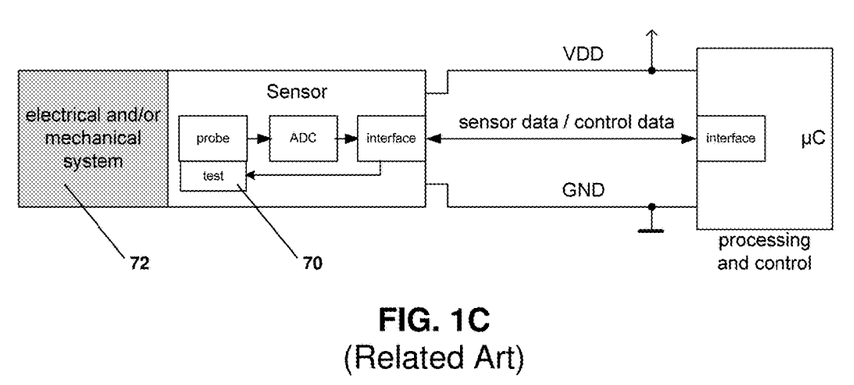
FIG. 1C is a block diagram of a conventional single path sensor system with a superimposed test signal.

Thus, other conventional solutions, such as the one depicted in FIG. 1B, have used two redundant magnetic field sensors 40 and 42 to meet SIL requirements. Obviously, a considerable drawback of these solutions is the corresponding doubling of the cost, for not one but two sensors. Still other solutions, such as one depicted in FIG. 1C, propose a defined superimposed test signal 70 outside the characteristic signal frequency ranges of the system, such as magnetic field sensors with an additional on-chip conductor loop or pressure sensors with superimposed electrostatic coupling to the sensor. Obviously, such test signals could be also generated outside the sensor system, e.g., by a device connected to the mechanical system 72 influencing the magnetic measurement and thus providing feedback which can be diagnosed. Nevertheless, such setups can be more expensive, may require a higher power consumption, and may introduce influences to the main function as well and require a specific physical set-up which is not feasible in many cases, which also means they cannot be used in general.

Additionally, conventional approaches do not address or provide self-testing and related diagnostic coverage of two-dimensional (2D) or three-dimensional (3D) sensors, which are increasingly used in automotive and other high-integrity applications. For example, 3D sensors can be used in angular speed applications, such as off-axis angle and angle speed measurements in brushless DC motors or steering angle sensors, among others. The addition of a third axis can provide safety advantages using additional attributes form the related mechanical system, though sufficient diagnostic coverage of the sensor itself remains an important task. Fundamentally, implementing highly integrated and thus cost-effective diagnostic functionality for sensors within a given electromechanical system in safety-critical applications, such as those required to meet SIL and/or other applicable safety standards, remains a challenge.

SUMMARY

Embodiments relate to integrated circuit (IC) sensors and more particularly to IC sensor diagnostics using multiple (e.g., redundant) communication signal paths, wherein one or more of the communication signal paths can be diverse (e.g., in hardware, software or processing, an operating principle, or in some other way) from at least one other of the multiple communication signal paths.

In an embodiment, a monolithic integrated circuit sensor system comprises a first analog-to-digital converter (ADC) in a first signal channel; a second analog-to-digital converter (ADC) in a second signal channel; and a first sensor device configured to sense a physical characteristic, wherein the first sensor device is coupled to both the first and second ADCs to provide a signal related to the physical characteristic to both the first and second ADCs, wherein a comparison of signals between the first and second signal channels after the first and second ADCs can detect an error in the sensor system.

In an embodiment, a method comprises providing a sensor system comprising at least one sensor to sense a first physical characteristic; providing at least two analog-to-digital converters (ADCs) coupled to the at least one sensor; and providing circuitry to compare signals from the at least two ADCs to detect whether an error has occurred in the sensor system.

In an embodiment, an integrated circuit sensor system comprises a first sensor device configured to sense a first physical characteristic and coupled to first signal path; a second sensor device configured to sense the first physical characteristic and coupled to a second signal path; a third sensor device configured to sense a second physical characteristic different from the first physical characteristic and coupled to the second signal path; and circuitry coupled to the first and second signal paths and configured to compensate at least one of a signal from the first sensor device or a signal from the second sensor device based on a signal of the third sensor device and to provide signals from the first, second and third sensor devices to an external control unit for a signal plausibility check using at least the signal from the third sensor device.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION

Embodiments relate to integrated circuit (IC) sensors and more particularly to IC sensor diagnostics using multiple (e.g., redundant) communication signal paths, wherein one or more of the communication signal paths can be diverse (e.g., in hardware, software or processing, an operating principle, or in some other way) from at least one other of the multiple communication signal paths. Embodiments can relate to a variety of sensor types, implementations and applications, including multidimensional magnetic field and other sensors. In embodiments, the sensors comprise Hall-effect sensors, magnetoresistive sensors, or other magnetic field sensors. In still other embodiments, additional or other sensors are implemented, including temperature, pressure, current, force, stray field, light, optical, mechanical stress, torque, acceleration and others. Some embodiments can use a combination of sensors, such as one or more magnetic field sensors to sense a magnetic field and one or more related temperature sensors to provide temperature compensation. The sensors can be coupled to one or more analog-to-digital converters (ADCs), and each sensor can be coupled to an ADC in a unique or redundant signal path in embodiments. One or more of the ADCs can comprise successive approximation ADCs (SAR-ADCs) in embodiments, though other ADCs, including flash ADCs, tracking ADCs and/or sigma-delta conversion ADCs, among others, can be used with or instead in other embodiments.

In an embodiment, a method comprises providing a main sensor signal and a diverse method of two sensor signals measuring a physical characteristic; and providing a redundant or multiplexed single signal path, based on an analog-to-digital converter and digital signal processor (DSP) or analog signal path, to compensate the main sensor signal for this physical characteristic.

Embodiments of these systems and/or methods can be configured to meet or exceed relevant safety or other industry standards, such as SIL standards. SIL standards can include automotive SILs, or ASILs. SILs can be defined by the IEC 61508 standard, while ASILs can be defined by the ISO/DIS 26262 standard as adopted from the IEC 61508 for E/E-systems for road vehicles, at the time of filing this application, for example. These standards aim to avoid unreasonable risks of failures in increasingly complex systems which can include software, hardware and other interrelated or interconnected components. There are four different levels (i.e., 1-4 for SIL and A-D of ASIL) which specify the level of risk associated with a system or component. Level 4 or D is the highest, most stringent level, with level 1 or A being the lowest, least stringent. This comparison does not imply that SIL 4 or ASIL D ratings can be directly compared. For a road vehicle, an ASIL D requirement according to ISO 26262 could be considered to be more similar to an SIL 3 requirement of the IEC 61508. This is because the scope of SIL 4 rating requirements is used for large-scale industrial entities, which can include preventing significant environmental impacts and a high number of casualties, for example.

Figure 2A:
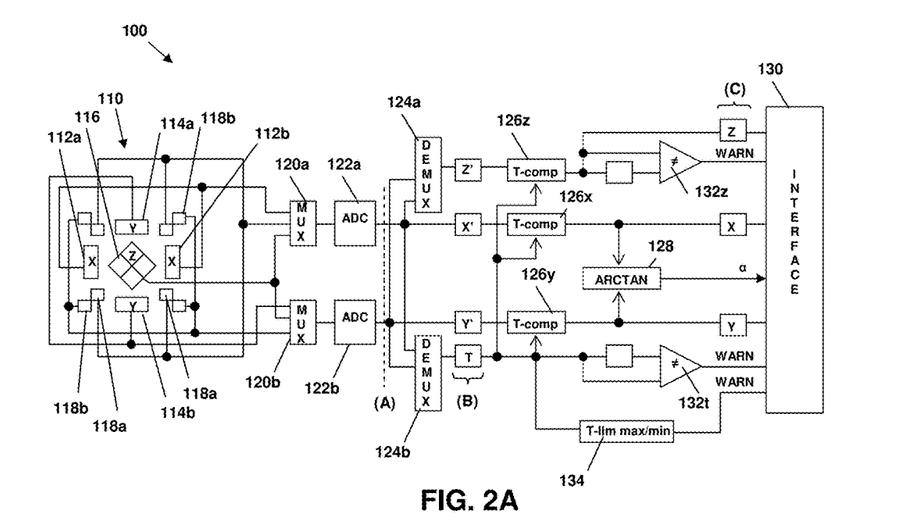
FIG. 2A is a circuit block diagram of a sensor system according to an embodiment.

Referring to FIG. 2A, a conceptual block diagram of a sensor system 100 according to an embodiment is depicted. Embodiments of system 100 can be designed to provide a sufficient or necessary level of diagnostic coverage of the measurement paths of the sensors while at the same time providing a minimal level of redundancy to keep chip area and cost requirements to a minimum. System 100 can comprise a monolithic integrated circuit in embodiments, or system 100 can comprise multiple chips and/or circuits in other embodiments. In still other embodiments, some functions and tasks can be carried out by externals components, including one or more receivers communicatively coupled with system 100.

System 100 comprises a three-dimensional magnetic field sensor array 110 in the embodiment depicted in FIG. 2A, comprising two vertical Hall-effect sensor elements 112a and 112b, and 114a and 114b, to sense each of the Bx and By components of the magnetic field, respectively, and a lateral Hall-effect sensor element 116 to sense the Bz component of the magnetic field. In other embodiments, other sensor types and/or configurations can be used. For example, system 100 can comprise a redundant sensor configuration including a main sensor and a secondary sensor, such as Hall-effect or magneto-resistive (xMR, including GMR, AMR, TMR, etc.) sensors measuring at least one, such as two, three or more, component of Hx, Hy, Hz and Bx, By, Bz magnetic fields, though these sensors or those implemented in other embodiments, including the embodiment of FIG. 2A, can comprise other types of sensors and are not limited to magnetic field sensors. For example, other magnetic field, angle, current, pressure, acceleration, force, torque, optical, light or other sensors can be used in other embodiments.

System 100 can also comprise one or more additional sensors, also considered secondary, auxiliary or ancillary sensors. These sensor(s) can include temperature, force, mechanical stress, current, magnetic field or some other sensor format in various embodiments, with more than one implemented in some embodiments (e.g., temperature and stress). In the embodiment of FIG. 2A, system 100 comprises a plurality of temperature sensor elements 118a and 118b in a redundant configuration to measure temperatures within or proximate sensor array 110, signals of which can be used for temperature compensation in embodiments. In system 100, sensor elements 118a and 118b can be arranged proximate or form part of (i.e., be arranged on the same die and/or in the same package) sensor array 110. In embodiments, one or more of sensor elements 118a and 118b are arranged proximate one or more of sensor elements 112a, 112b, 114a, 114b and/or 116 in order to sense temperatures proximate those devices. Temperatures sensed by sensor elements 118a and 118b then can be used in temperature compensation calculations related to signals from sensor elements 112a, 112b, 114a, 114b and/or 116. As mentioned, compensation calculations also can include measurements of additional sensor elements, such as on-chip piezoelectric stress effects of Hall sensors or homogenous background fields affecting a differential magnetic field measurement in current sensors, as only some examples.

In embodiments, a positive/negative temperature sensor scheme, i.e., using negative temperature coefficient (NTC) sensors, can be implemented for a redundant temperature measurement to reduce or avoid the risk of common and systematic faults in the temperature measurement. In such an embodiment, the NTC values can be used in defect detection by comparing both values with each other, while the other values (e.g., proportional to absolute temperature, or PTAT) can be used in a signal compensation calculation or routine. This is because the temperature measurement uses different physical properties of the semiconductor (e.g., one based on a bandgap voltage measurement of a semiconductor device while the other is based on a poly-resistor value) such that it is unlikely that the measurement results show the same faulty result if one physical property of the semiconductor is affected by a defect, an external influence or a systematic error. Still other sensor types, arrangements, configurations and schemes can be implemented in other embodiments, with those depicted and discussed being only some embodiments.

Sensors other than temperature sensors can be used in embodiments, including for compensation or other purposes, as the particular configuration of any or all of the sensors can vary according to a particular application. For example, sensors 118a and 118b can comprise pressure sensors, stress sensors or one or more of these or other types of sensors in various embodiments. The particular example embodiment depicted in FIG. 2A is but one example and is not limiting with respect to other embodiments, including any that may be embodied by or related to the claims.

In embodiments, a first biasing or reference scheme can be used for sensor elements 112a, 112b, 114a, 114b, 116 and 118a, and a second biasing or reference scheme can be used for sensor elements 118b. In other words, the main signal (e.g., the magnetic field sensed by the sensor comprising sensor elements 112a, 112b, 114a, 114b and 116) and a first temperature measurement from sensor elements 118a can have the same biasing in one embodiment, while the second temperature measurement from sensor elements 118b has a different biasing. Variations of biasing and/or reference schemes can be used in other embodiments.

Sensor array 110 (which refers generally herein to sensor elements 112a, 112b, 114a, 114b, 116, 118a and 118b unless otherwise mentioned or explained) is communicatively coupled to a first multiplexer (MUX) 120a and a second MUX 120b. In one embodiment depicted in FIG. 2A, sensor elements 112a, 112b and 118a are coupled with MUX 120a; sensor elements 114a, 114b and 118b are coupled with MUX 120b; and sensor element 116 is coupled with both MUX 120a and 120b. This coupling arrangement in the context of MUX 120a and 120b (and ADC 122a and 122b) will be discussed in more detail below.

Each MUX 120a and 120b is communicatively coupled with an ADC 122a and 122b, respectively. Any ADC, such as a flash, tracking, single- or dual-slope, successive-approximation register (SAR), successive-approximation tracking (SAT), Nyquist-rate, noise-shaping sigma-delta, averaging dual slope or another ADC can be used. While ADCs 122a and 122b can be the same type of ADC in embodiments, they need not be so in other embodiments for diversity considerations, e.g., to avoid systematic faults that could result from using a single design.

As previously mentioned, sensor elements 112a, 112b and 118a are coupled with MUX 120a; sensor elements 114a, 114b and 118b are coupled with MUX 120b; and sensor element 116 is coupled with both MUX 120a and 120b in the embodiment of FIG. 2A. There are at least several advantages to such a configuration. First, the X and Y signals (i.e., the Bx and By magnetic field components) sensed by sensor elements 112a/112b and 114a/114b can be sampled synchronously, as sensor elements 112a and 112b are coupled with MUX 120a while sensor elements 114a and 114b are coupled with MUX 120b. Second, the Z signal (i.e., the Bz magnetic field component) can be sampled redundantly and via two different signal channels, as sensor element 116 is coupled with both MUX 120a and MUX 120b. Third, two temperature measurements can be obtained (i.e., a first via sensor elements 118a coupled to MUX 120a, and a second via sensor elements 118b coupled to MUX 120b).

Figure 4A:
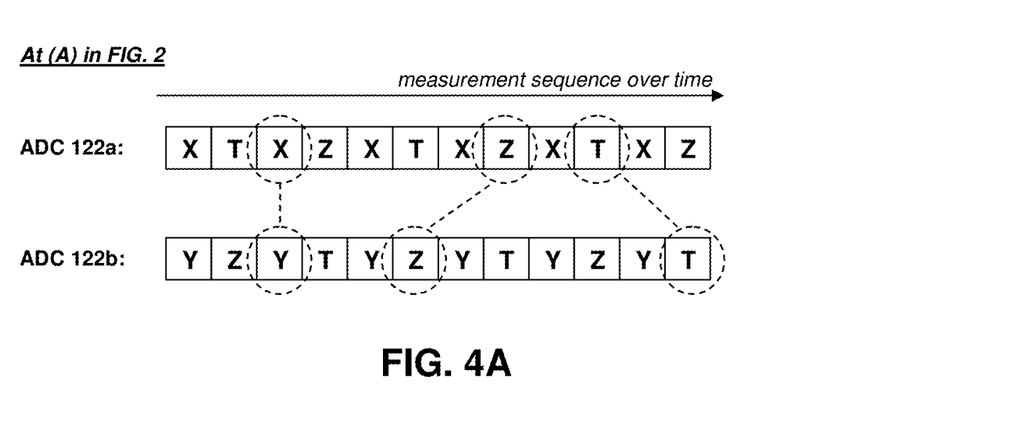
FIG. 4A is a diagram of a measurement signal over time according to an embodiment.
Figure 4B:
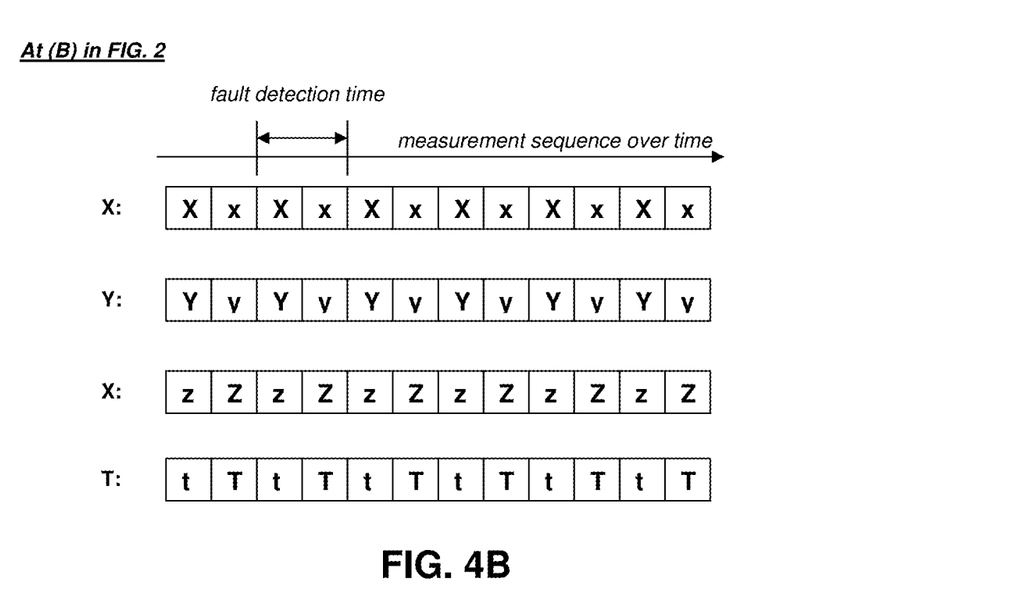
FIG. 4B is a diagram, over time, of the measurement signal of FIG. 4A after demultiplexing according to an embodiment.

FIGS. 4A and 4B assist in illustrating some of these advantages, along with basic operation and one example of a multiplexing scheme of values from sensor array 110, MUCs 120a and 120b, ADCs 122a and 122b, demultiplexers (DEMUXs) 124a, 124b and other circuitry of system 100 in an embodiment. FIG. 4A illustrates output signal sequences from ADCs 122a and 122b at (A) in FIG. 2A. ADC 122a outputs a recurring sequence of X (sensor elements 112a and 112b, T (sensor elements 118a), X and Z (sensor element 116). ADC 122b outputs a recurring sequence of Y (sensor elements 114a and 114b), Z (sensor element 116), Y and T (sensor elements 118b). In an embodiment, the X and Y measurements are synchronous, as illustrated in FIG. 4A, which can be advantageous for a precise angle calculation. The redundant Z measurements enable a check of ADC 122a vs. ADC 122b to detect an error that may occur in one or the other (or, if the same at each, in ADCs 122a, 122b in some embodiments). For example, a value change between successive Z measurements of redundant ADCs can be used to detect defects if the different in values is within or out of an acceptable predetermined range. In some embodiments, the third axis (e.g., Z) measurement can be used solely for a plausibility or operability check of ADCs 122a and 122b, as the same sensor signal is processed sequentially by redundant ADCs 122a and 122b. This can be advantageous when using magneto-resistive sensors for the X/Y axis measurement (i.e., direction of Hx/Hy fields) and a Hall sensor element for the Z axis measurement (i.e., magnetic flux density or Bz), which includes in addition to checking the ADCs 122a, 122b an additional operability check of the system 100 together with the external mechanical system (e.g., mounting of the sensor or an external magnet). The temperature measurements via sensor elements 118a and 118b are redundant and independent, as shown, and in embodiments can enable detection of biasing defects, as in at least one embodiment sensor elements 118a and 118b are differently biased as discussed above. This further provides an operability check of sensor array 110. In embodiments, the sampling rates of ADCs 122a and 122b are at least twice the required overall sample rate of sensor system 100 in order to allow for multiplexing of two channels.

The signals output by ADCs 122a and 122b (e.g., those depicted in FIG. 4A) are then communicated to two demultiplexers (DEMUX) 124a and 124b. The signals after DEMUXes 124a and 124b, at (B) in FIG. 2A, are depicted in FIG. 4B. The lowercase signal designators indicate that the value is the same as the last, which is stored follows from the measurement sequence as repetition. In other words, X and Y are sampled synchronously, then Z and the first T are sampled, then X and Y again, then Z again and the second T, etc. Flipping the two measurements of Z and T and changing the source and method for T allows the detection time or period of a variety of defects or errors, including a bad temperature measurement (i.e., due to the two sources for T), an error in ADC 122a or 122b (i.e., due to providing a Z value from the same sensor element to different ADCs), an error in temperature compensation (i.e., due to using different methods for T measurement and using separate DEMUXs and ADCs) or a digital signal processor (DSP) (i.e., due to using different compensation methods for the two methods of T measurements and similar Z values), an error in DEMUX 124a or 124b (i.e., communicating similar and different values through these elements) and/or others. This short detection time provides advantages for quick detection (e.g., within a few measurement samples) of errors, defects or other problems in system 100 without the drawbacks discussed above with reference to FIGS. 1A, 1B and 1C.

Returning to FIG. 2A, after (B) the signals from the main sensor elements (e.g., the X, Y and Z signals) can be compensated. As previously discussed, temperature compensation is used for the magnetic field sensor elements of system 100, but other compensation types and methodologies can be used in other embodiments, with magnetic field sensor elements or some other type of sensor element. In system 100, this temperature compensation takes place at 126x, 126y and 126z, with the demultiplexed temperature signal (FIG. 4B) from DEMUX 124b provided to each compensation block 126x, 126y and 126z. In one embodiment, the same temperature compensation routine can be implemented by each compensation block 126x, 126y and 126z, though in other embodiments different routines can be used.

In another embodiment, a value scheme can be implemented in accordance with FIG. 4B in which time-multiplexed and value-multiplexed samples of main and secondary channels are transmitted to an external ECU or other device. In the ECU or other device, either the time-multiplexed, the value-multiplexed or both samples can be used in a comparison or verification of data from one or more of the sensors, channels or other system components. For example, it has been discussed how temperature or other secondary sensor data can be used to compensate data or signals of a main sensor, such as a magnetic field sensor. In embodiments, the compensation data or information from the temperature or other secondary sensor data can in addition or instead be used in a plausibility check by the ECU to confirm that the data or information is as expected. In one embodiment, data from multiple secondary sensors can be compared in the ECU to confirm that it is the same, within some range, or conforms to some other predefined characteristic. In another embodiment, an overall compensation signal can be checked with respect to an accepted or expected range or value. For example, if a system has an expected operating temperature range of 30 degrees C. to 70 degrees C. and a temperature sensor provides a reading of 90 degrees, it may be more likely that the temperature sensor has malfunctioned (or that at error has occurred somewhere within the system) than that the system is operating at a temperature that much higher than the expected range. In another example, one temperature sensor measuring 50 degrees and another measuring 80 degrees could indicate a sensor and/or system error. Transmitting this data to the ECU or other device and using it for a plausibility check or other comparison it can provide an additional or alternative level of diagnostic coverage.

Figure 2B:
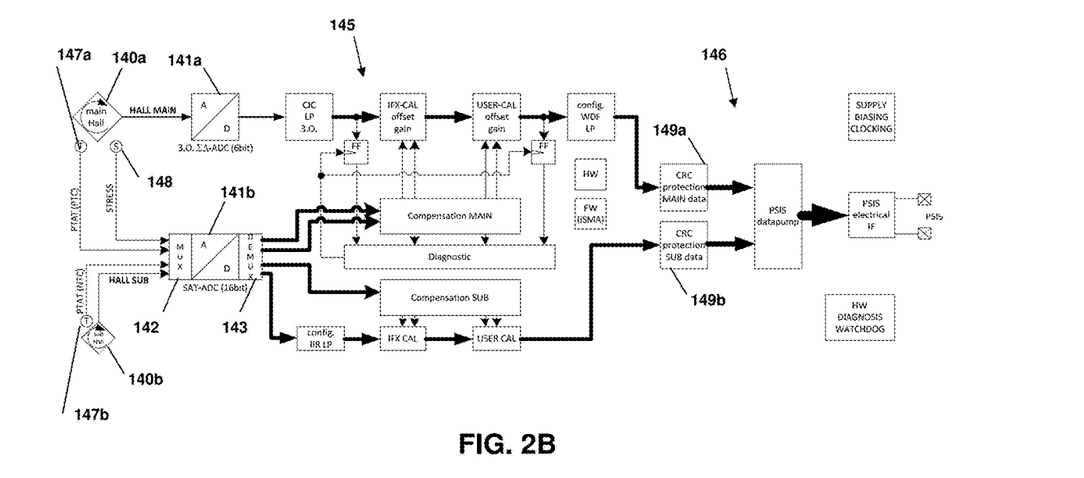
FIG. 2B is a circuit block diagram of a sensor system according to an embodiment.

FIG. 2B shows another embodiment that, in contrast to FIG. 2A, comprises a one-dimensional sensor 140a. As previously discussed, the type of sensor(s) implemented in any embodiment can vary (e.g., FIG. 2B depicts a one-dimensional Hall sensor but can comprise some other type of sensor in other embodiments), and principles of the embodiments of FIG. 2A or 2B can apply to the other, or to other embodiments and examples discussed herein. Like the system of FIG. 2A, the system of FIG. 2B also implements features and aspects of resource sharing. For example, a first signal path comprising the first or main sensor 140a and a first ADC 141a can be a primary or dedicated measurement path for the main signal, while a secondary signal path incorporates a redundant second sensor 140b (e.g., another one-dimensional Hall sensor, or some other type of sensor) and a second ADC 141b. ADC 141b can be embedded in or with a signal multiplexer (MUX) 142 and demultiplexer 143. While a diagnosis of the main signal measured by sensor 140a can be compared by a second signal from sensor 140b, a temperature or other compensation measurement can be conducted using a diverse setup of a positive temperature coefficient sensor 147a and a negative temperature coefficient sensor 147b, signals from both of which can be converted by ADC 141b. Additional measurements, such as measuring on-chip stress or some other physical quantity by a sensor 148, also can be provided to ADC 141b.

In principle, ADC 141b can be an independent ADC for sensor 140b in embodiments, if advantageous or suitable for, e.g., performance or other reasons. The embodiment of FIG. 2B, however, is an example of a highly efficient implementation that does not sacrifice functional diagnosis of the sensor system. Following the ADCs 141*a* and 141*b*, the signals can be processed by processing circuitry 145, similar to other embodiments, and communicated to an ECU or other device via interface 146. In embodiments, the signals from each signal path are provided to the ECU independently, such as in two separate data streams. The signals can be protected using a cyclic redundancy check (CRC) 149*a*, 149*b* for each path. In the embodiment of FIG. 2B, the signal processing circuitry can also include a redundant re-calculation of the first signal processing result, though this can omitted in some embodiments.

Figure 5A:
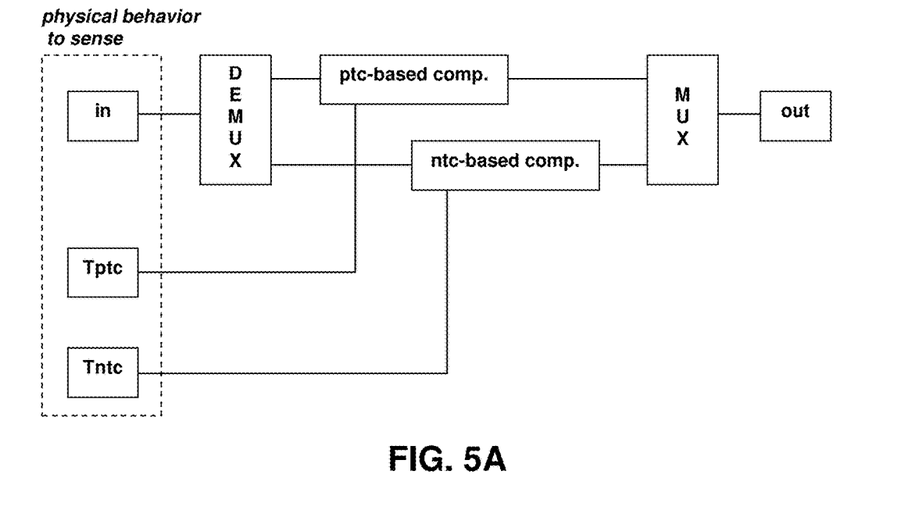
FIG. 5A is a block diagram of an improved redundant temperature compensation scheme according to an embodiment.

As previously mentioned, some embodiments can implement positive and negative temperature compensation schemes. FIG. 5A is a block diagram of one such scheme, in which raw data is input, two different compensation schemes are implemented (one positive, PTC-based compensation, and one negative, NTC-based compensation), and compensated data is output. Tptc and Tntc calculations can introduce alterations to the calculations, and the results can be compared to detect errors, such as within a predefined tolerance. Such a scheme enables detection of systemic faults as well as intermittent or random faults that can occur in the compensation algorithm or related hardware, including a DSP or hardware path. In one embodiment comprising a diverse implementation, a bandgap principle can be implemented for the positive temperature compensation and a poly-resistor for the negative temperature compensation. Using different calculation schemes, two values can be determined and provided for evaluation to detect the aforementioned and other errors or defects.

Figure 5B:
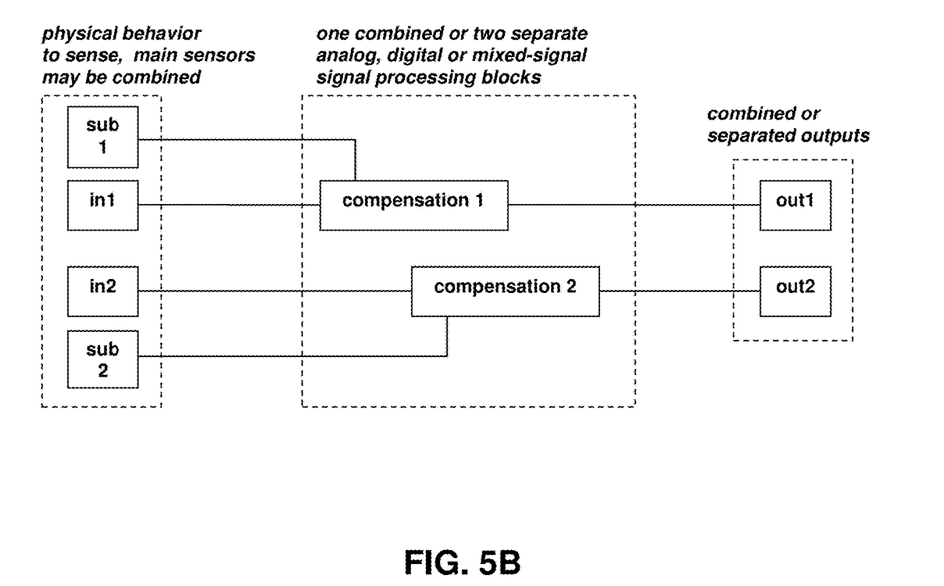
FIG. 5B is a block diagram of a redundant compensation scheme according to an embodiment.

FIG. 5B shows a more generalized approach, in which a physical behavior is measured using redundant sensors that use certain compensation by sub-sensors. By using inverse mechanisms for the sub-sensors, e.g., a PTC and NTC behavior (if the compensation is temperature dependent; similar approaches can be implemented for stress or other dependencies), a redundant setup with diverse compensation principles can significantly increase the tolerance with respect to systematic faults of the implementation. As the compensation schemes are inherently different, it is also possible to jointly implement them in one signal processing block, assuming that a certain fault model will have a different effect on the two schemes, causing a detectable deviation between the channels. If the focus for fault tolerance resides on the signal processing, the paths can be implemented redundantly while the main sensors (in1 and in2) can be joined to a single sensor in supplying both signal processing paths with its sensor data.

Figure 3:
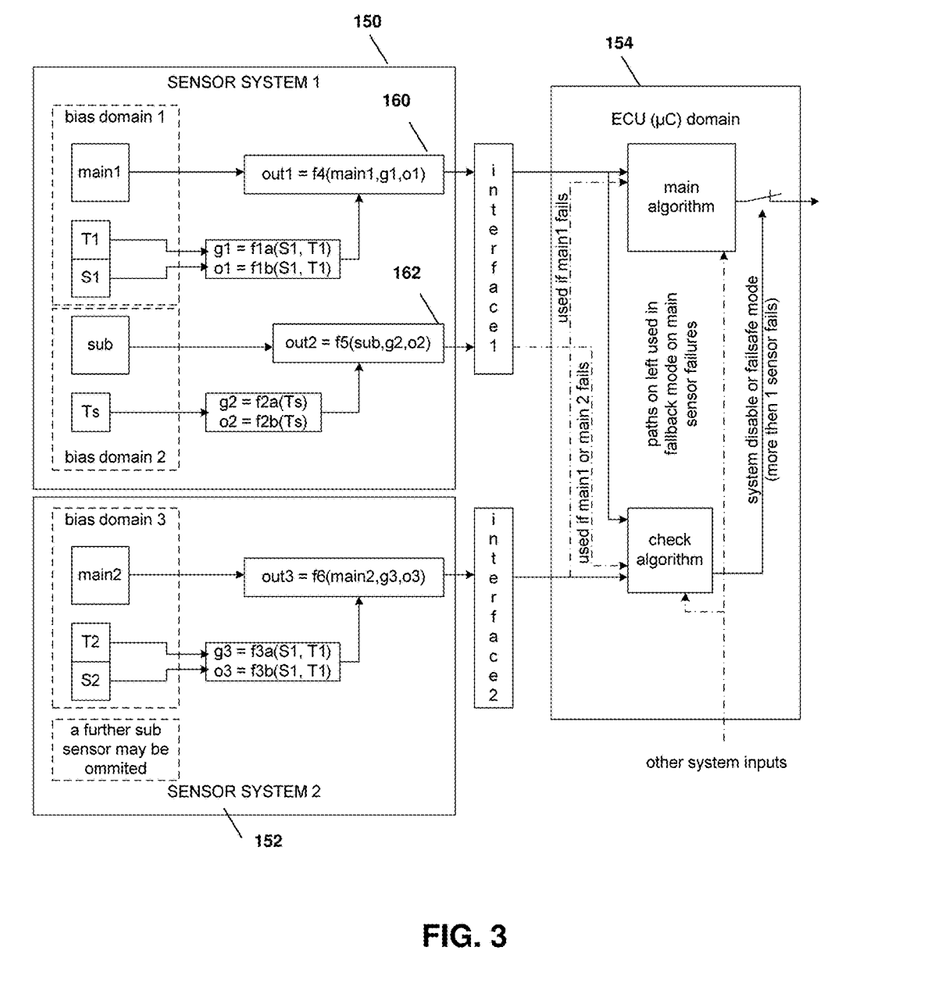
FIG. 3 is an application block diagram of a system comprising two sensor systems, wherein one incorporates a redundant measurement path according to an embodiment.

FIG. 3 depicts an application of such a redundant sensor system 150 together with a second non-redundant sensor system 152 (which can be another redundant sensor system as well), where the results of the different paths can be used to replace each other for the main algorithm or the check algorithm in ECU 154 implementing the system functionality of the electrical and/or electronic (E/E) system. This setup allows continuing of operation if one of the sensors main1, main2, sub or its related bias domain or following signal path fails; only if two of the three sensors fail, system 150 can be set to a safe state or can continue in a degraded or reduced operation mode, which is dependent on the level of safety required. In another embodiment, a second redundant sensor similar to 150 used for the second sensor system 152 can prolong operation when two sensors fail or if one of the two sensor systems fails completely.

Furthermore, in a 3D sensor the main calculation can comprise two sensor signals X and Y that are temperature compensated in a first processing path 160 while the sub sensor uses the sensor signal Z, which is also multiplexed with the two processing paths 160, 162 similar to the scheme shown in FIGS. 4A and 4B.

Figure 6:
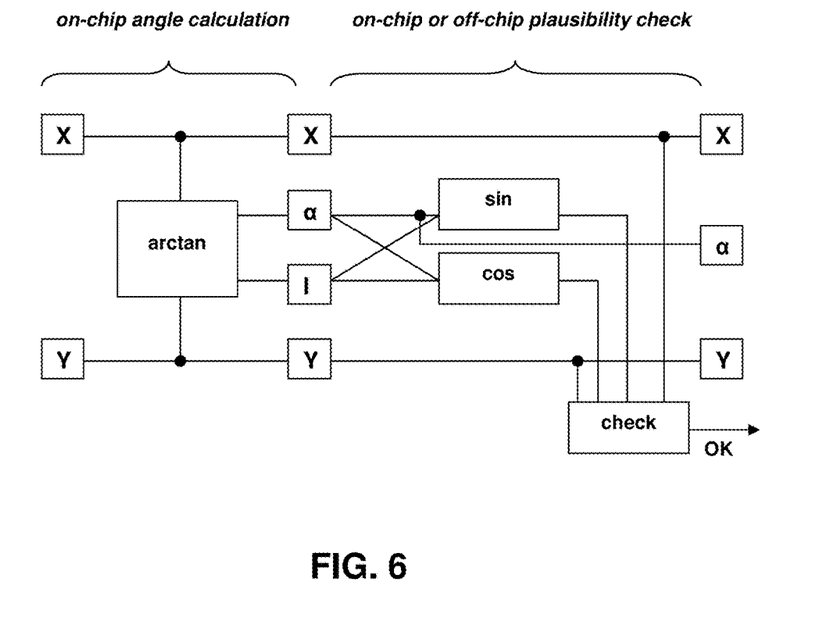
FIG. 6 is a block diagram of an angle determination and checking scheme according to an embodiment.

Returning to FIG. 2A while also referring to FIG. 6, an angle determination can be made at ARCTAN block 128 from the temperature-compensated X and Y measurements, such as by determining the arctangent of an angle between the X and Y component measurements. This angle determination also is shown in the first portion of FIG. 6. Following the angle determination, a plausibility check can be implemented using additional sine and cosine functions and comparing one or both of these with the X and/or Y values. In one embodiment, both the sine and cosine are used for an increased level of fault or error detection, though in other embodiments it can be sufficient to determine only one or the other. Additionally, the plausibility check can be carried out on-chip or off-chip in embodiments.

The angle calculation at ARCTAN block 128 can be carried out on-chip, and the calculation can be verified in one embodiment by a recalculation off-chip after the compensated X, Y and Z values as well as the calculated angle a are transmitted to a receiver or other device or circuitry via interface 130. Additional checks also can be performed within, by or for system 100. For example, comparators 132*z* and 132*t* can be used to check for expected values of Z and T, such as within some predefined tolerance(s). Temperature limits can also be checked by temperature limit block 134. WARN signals or flags can be provided to interface 130 by comparators 132*z* or 132*t*, or block 134, or in other embodiments any WARN signal can trigger some behavior or action by interface 130 for communication or detection off-chip, such as using an alternate pulse-width modulated (PWM) frequency, clamping, or switching interface 130 off, as examples. The compensated X, Y and Z signals at (C) optionally can be clocked, such as to introduce a delay in order to synchronize one or more of the signals and/or calculations.

In relation to the application shown in FIG. 3, an alternate, redundant sensor system can be implemented for 150, where the first sensor system delivers X/Y vectors from an angular measurement plus the corresponding angle and length of the resulting vector, and the second sensor system delivers the X/Y vectors only. ECU 154 uses this redundancy in a similar method for a failover scenario when either the first X/Y or the second X/Y vectors do not match with the delivered angle signal, e.g., caused by a defective sensor or sensor path. One implementation uses a high-end GMR angular sensor comprising digital compensation and output of X,Y and angle information including the diagnostic methods mentioned, and a second GMR sensor bridge comprising only an X and Y vector that is converted and used in ECU 154. In this sense, multiple variations of sensors and processing methods for such an application are possible.

Figure 7:
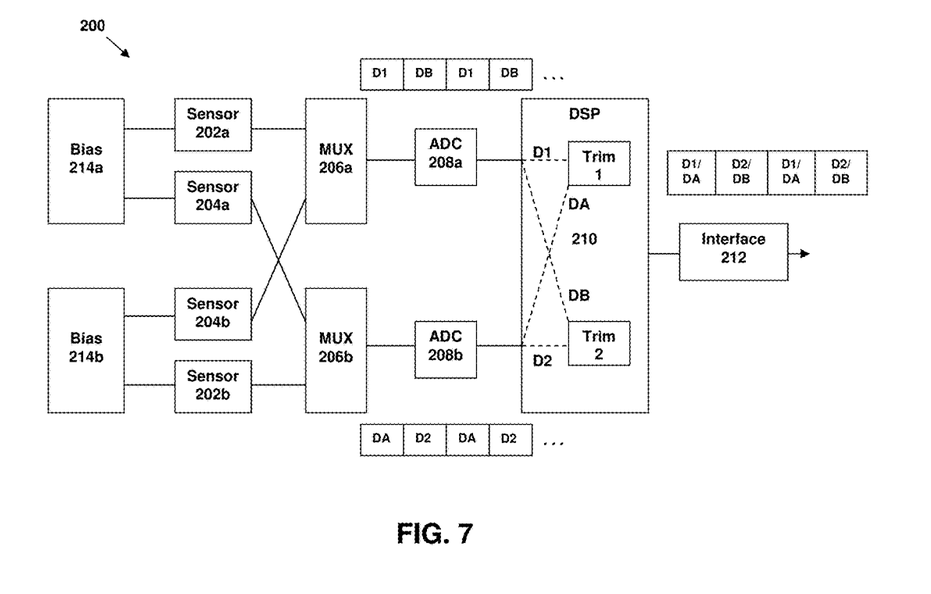
FIG. 7 is a circuit block diagram of a sensor system according to an embodiment.

Coming back to the sensor system as shown by 100 and used in application 122, further adaptations can be made, or other implementations used, to accommodate particular characteristics of an application, sensor type or other factor. For example, while sensor system 100 comprised a 3D sensor 110, a similar (though perhaps simplified) system 200 can be implemented for a 1D sensor, as depicted in FIG. 7.

System 200 comprises redundant signal paths or channels and redundant sensors 202*a* and 202*b* configured to sense the target characteristic and therefore can be considered to be the primary measurement sensors in this system. For example, and continuation the example of system 100 of FIG. 2A, sensors 202*a* and 202*b* can comprise magnetic field sensors, though in contrast with sensor 110 of system 100 are 1D sensors. Sensor 202b can be used to perform a plausibility check of sensor 202a and thus can be the same as or merely similar to sensor 202a. For example, both sensors 202a and 202b can comprise magnetic field sensors, though sensor 202b can be a less expensive, less complex sensor, as the higher accuracy desired of sensor 202a is not necessary in some embodiments.

System 200 also comprises secondary sensors 204a and 204b, which can be similar to temperature sensor elements 118a/b of system 100. Secondary sensors 204a and 204b can be implemented for compensation, trimming or some other secondary purpose and can comprise temperature, pressure, or some other suitable type of sensor, as discussed above with respect to system 100. For example, sensors 204a and 204b can comprise temperature sensors used for temperature compensation, with one of sensors 204a or 204b implementing a first compensation scheme (e.g., positive temperature compensation using, e.g., PTAT) and the other of the sensors 204b or 204a implementing a second compensation scheme (e.g., negative temperature compensation).

Sensors 202a and 204b are coupled to a first MUX 206a, and sensors 202b and 204a are coupled to a second MUX 206b. MUX 206a is coupled to a first ADC 208a, and MUX 206b is coupled to a second MUX 208b. ADCs 208a and 208b can comprise virtually any type of ADC, including those discussed above with respect to system 100. ADCs 208a and 208b are coupled to a DSP 210, which is in turn coupled to an interface 212, which can be a single or dual interface in embodiments. In other embodiments, system 200 can comprise more than one DSP, such as a first DSP coupled to the ADC 208a and a second DSP coupled to ADC 208b.

In operation, a first bias signal is applied to sensors 202a and 204a by bias 214a, and a second bias signal is applied to sensors 202b and 204b by bias 214b. Measurement signals are communicated by sensors 202a, 202b, 204a and 204b to ADCs 208a and 208b via MUXs 206a and 206b as depicted. The signal at ADC 208a is D1, DB, D1, DB . . . , where D1 is data from sensor 202a and DB is data from sensor 204b. The signal at ADC 208b is DA, D2, DA, D2 . . . , wherein DA is data from sensor 204a and D2 is data from sensor 202b. These signals are provided to DSP 210, which can implement first and second trimming or compensation algorithms in embodiments. For example, a first algorithm can be a direct polynomial, and a second an inverse polynomial, though others can be used in other embodiments. Output signals of DSP 210 are provided to interface 212, for example D1 with DA, D2 with DB, D1 with DA, D2 with DB . . . , wherein D1 with DA should be the same as D2 with DB. If they are not equal, an error has occurred and by this comparison can be detected.

In embodiments, the upper signal path or channel (e.g., that comprising sensor 202a, with "upper" referring only to the layout of FIG. 7 on the page) is a higher accuracy channel, while the channel of sensor 202b is a less accurate channel, relative to the channel of 202a. Such a configuration can help to reduce costs while still providing redundancy and fault detection. The different compensation schemes implemented by sensors 204a and 204b also can have different accuracies, with the scheme implemented by sensor 204b being of lower accuracy as part of the lower accuracy channel, at least in this example. Additionally, the channels can be sampled at different rates, with the higher accuracy channel generally sampled at a higher rather than the less accurate channel. For example, the less accurate channel can be sampled every nth value in one embodiment. Finally, the less accurate channel can use a different conversion method in one embodiment, which is further optimized either for robustness, cost of implementation, or both.

Figure 8:
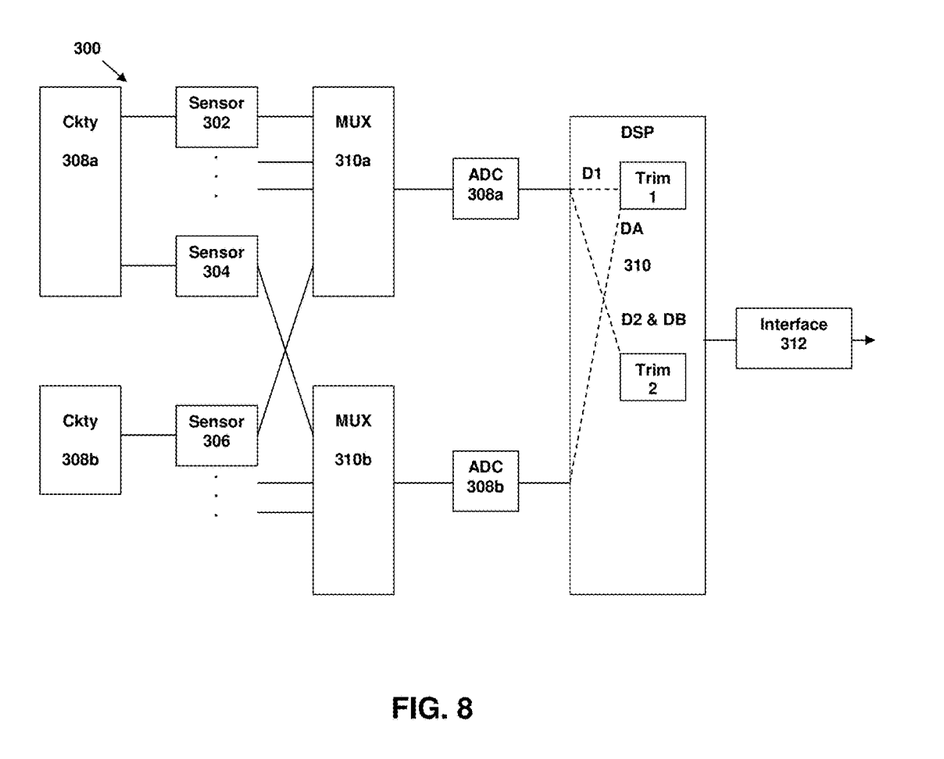
FIG. 8 is a circuit block diagram of a sensor system according to an embodiment.

Still another example embodiment of a system 300 is depicted in FIG. 8, with system 300 comprising a basic setup still sufficient to provide basic diagnostic coverage. For example, in on embodiment system 300 provides diagnostic coverage in that it can provide a warning or alert if at error occurs, though system 300 may not be able to localize the error (i.e., identify which component, circuitry or measurement caused the error).

In FIG. 8, system 300 comprises at least one primary sensor 302, such as one like sensor 110 of FIG. 2A or any of the other sensors discussed herein or suitable for applications of one or more of the systems. System 300 also comprises at least two secondary sensors 304 and 306, which can comprise, e.g., temperature sensors in one embodiment, or some other type(s) of sensors in other embodiments. Sensors 304 and 306 can be configured to have or implement different characteristics as part of the diagnostic coverage provided by system 300. In one embodiment, sensor 304 can sense direct behavior, while sensor 306 can sense the inverse behavior of sensor 304 (e.g., positive and negative, similar to other embodiments discussed herein). Still other embodiments can use other, different behaviors or operations of sensors 304 and 306.

System 300 also comprises basic circuitries 308a and 308b coupled to sensors 302 and 304, and sensor 306, respectively. Circuitries 308a and 308b can provide biasing, as discussed elsewhere herein, and other basic functionalities and infrastructure for operation, as appreciated by those skilled in the art.

The primary channel or path of sensor 302 also comprises MUX 310a and ADC 308a, wherein these components can be similar to or different from those of similar components discussed elsewhere herein with respect to other embodiments. For example, ADC 308a (as well as ADC 308b) can comprise a SAR-ADC, a tracking ADC, a flash ADC, a sigma-delta ADC, or some other ADC in various embodiments. The signal path of sensor 306 comprises MUX 310b and ADC 308b, and both ADCs 308a and 308b are coupled to DSP 310. In other embodiments, as previously mentioned, more than one DSP can be included in system 300. DSP 310 is coupled to interface 312, with first and second trimming algorithms similar to as discussed above with respect to system 200 in at least one embodiment. In other embodiments, another interface can be included in system 300, such as one that is multiplexed (e.g., physically or time-multiplexed) to accommodate the dual-channel configuration of system 300.

Advantages of system 300 include a potentially simplified, lower cost implementation of a system which provides diagnostic coverage that is sufficient to meet at least minimum standards. Such an implementation can be advantageous in some applications and configurations.

Figure 9:
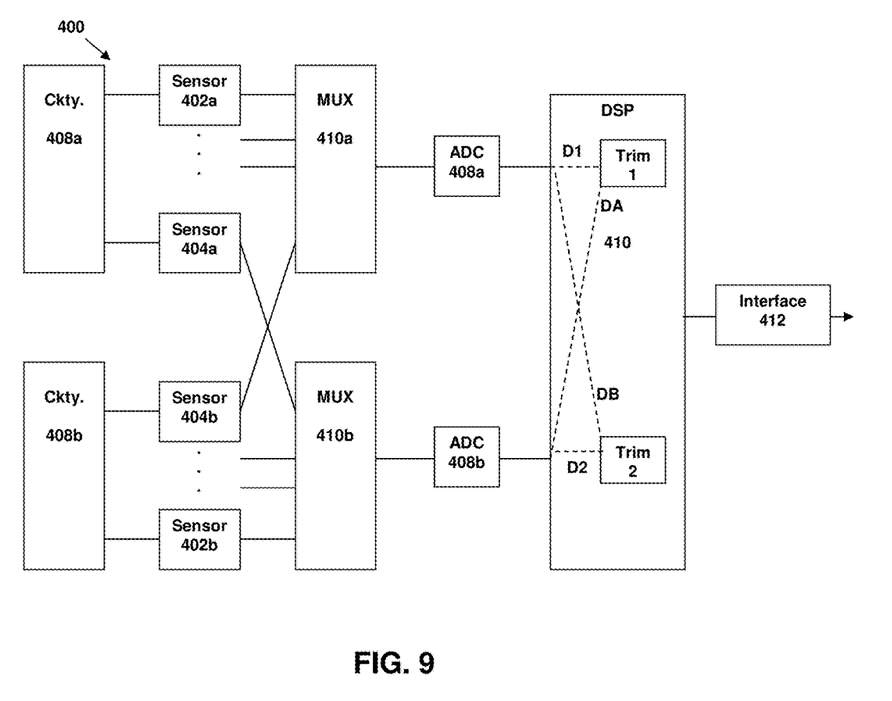
FIG. 9 is a circuit block diagram of a sensor system according to an embodiment.

Yet another system 400 is depicted in FIG. 9. System 400 is similar to both systems 200 and 300, and similar reference numerals (e.g., 202a and 402a; 308a and 408a, etc.) are used herein throughout to refer to similar elements unless otherwise discussed or made clear from the discussion. System 400 can comprise at least one up to an arbitrary number of sensors. Like system 200, system 400 comprises a primary sensor 402a in a first channel and a secondary sensor 402b in a second channel, where primary and secondary sensors 402a and 402b can be the same type of sensors (e.g., magnetic field, current, etc.) in embodiments. Additional ones of these sensors 402a and 402b also can be included in system 400, as illustrated. Additional sensors 404a and 404b are included in each channel and can comprise temperature, pressure or other suitable types of sensors that can be used to compensate or trim sensors 402a and 402b. In embodiments, and as in system 300 and others discussed herein, sensors 404a and 404b can implement different behaviors to provide diversity and/or plausibility checks of system 400. For example, they can be the inverse of one another, one can be positive and the other negative (e.g., PTC and NTC), etc. In embodiments, separate physical sensors are used for, e.g., the inverse, to reduce the risk of common-cause failures if a single sensor with merely its measurement signal inverted was used, though this could be implemented in some embodiments if the application or use were suitable and could allow for it.

The remaining components and operation of system 400 can be quite similar to those of other systems discussed herein (e.g., systems 200 and 300). System 400 is generally more symmetric between the first and second channels than system 300, in embodiments, and can exceed the minimum configuration of that system. Those skilled in the art will appreciate that other modifications and adaptations can be made to the particular systems depicted herein, such as to adapt to or accommodate a particular application or use or for some other purpose. The systems depicted and discussed herein therefore are merely examples used to illustrate various possibilities falling within the scope of the claims.

Numerous advantages can be provided by embodiments. For example, the reuse of some system components and/or routines can reduce chip area and development efforts while still providing a high level of integrity checking that meet or exceed applicable standards. Additionally, components related to the main or target signal can be arranged together, with only some add-on components for, e.g., compensation by temperature sensing with independent biasing, needed.

Another advantage is the high-level and number of faults and errors that can be detected in embodiments. These include those related to sensor biasing, ADCs, input multiplexing, supply voltage and current, output demultiplexing, DSP, angle calculation, compensation, interfacing, data storage, and still others. These are others can be accomplished, in part, by arrangements and methodologies discussed herein, including implementing independent temperature measurement, multiplexing at least one sensor axis measurement, plausibility checks and signal comparisons at various points, calculations carried out both on- and off-chip, using different vector lengths, using different parameter sets, polynomials, and/or different formulas, inversions and positive/negative configurations, among others.

Various embodiments of systems, devices and methods have been described herein. These embodiments are given only by way of example and are not intended to limit the scope of the invention. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the invention.

Persons of ordinary skill in the relevant arts will recognize that the invention may comprise fewer features than illustrated in any individual embodiment described above. The embodiments described herein are not meant to be an exhaustive presentation of the ways in which the various features of the invention may be combined. Accordingly, the embodiments are not mutually exclusive combinations of features; rather, the invention can comprise a combination of different individual features selected from different individual embodiments, as understood by persons of ordinary skill in the art. Moreover, elements described with respect to one embodiment can be implemented in other embodiments even when not described in such embodiments unless otherwise noted. Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended. Furthermore, it is intended also to include features of a claim in any other independent claim even if this claim is not directly made dependent to the independent claim.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims for the present invention, it is expressly intended that the provisions of Section 112, sixth paragraph of 35 U.S.C. are not to be invoked unless the specific terms "means for" or "step for" are recited in a claim.

What is claimed is:

1. An integrated circuit sensor system comprising:
   a first sensor coupled to a first signal channel and configured to sense a first physical characteristic;
   a second sensor coupled to the first signal channel and a second signal channel different from the first signal channel, the second sensor being configured to sense the first physical characteristic;
   a third sensor coupled to the second signal channel and configured to sense a second physical characteristic different from the first physical characteristic; and
   circuitry coupled to the first and the second signal channels and configured to:
      compensate, based on a signal of the third sensor, at least one of a signal from the first sensor and a signal from the second sensor;
      selectively sample the respective signals from the first, the second, and the third sensors to generate sampling sequences including samples of the respective signals; and
      provide the sampling sequences to an external controller configured to perform a signal plausibility check based on the sampling sequences.

2. The integrated circuit sensor system of claim 1, wherein the first physical characteristic is a magnetic field.

3. The integrated circuit sensor system of claim 2, wherein the second physical characteristic is a temperature.

4. The integrated circuit sensor system of claim 2, wherein the second physical characteristic is: a force, a mechanical stress, or an electrical current.

5. The integrated circuit sensor system of claim 2, wherein the first and the second sensors each comprise a magnetic field sensor that is configured to sense the magnetic field.

6. The integrated circuit sensor system of claim 5, wherein:
   the magnetic field sensor of the first sensor is configured to sense a first component of the magnetic field; and the magnetic field sensor of the second sensor is configured to sense a second component of the magnetic field different from the first component of the magnetic field.

7. The integrated circuit sensor system of claim 6, wherein the first component of the magnetic field is orthogonal to the second component of the magnetic field.

8. The integrated circuit sensor system of claim 1, wherein the external controller is further configured to perform a signal plausibility check on the first signal from the first sensor based on the second signal from the second sensor.

9. The integrated circuit sensor system of claim 1, further comprising:
a fourth sensor coupled to the second signal channel and configured to sense the first physical characteristic.

10. The integrated circuit sensor system of claim 9, wherein the fourth sensor is configured to provide a fourth signal to the external controller, wherein the external controller is further configured to perform a signal plausibility check on the first signal from the first sensor and the fourth signal from the fourth sensor based on the second signal from the second sensor.

11. The integrated circuit sensor system of claim 9, wherein:
the first physical characteristic is a magnetic field; and
the first, second, and fourth sensors each comprise a magnetic field sensor that is configured to sense the magnetic field.

12. The integrated circuit sensor system of claim 11, wherein:
the magnetic field sensor of the first sensor is configured to sense a first component of the magnetic field;
the magnetic field sensor of the second sensor is configured to sense a second component of the magnetic field; and
the magnetic field sensor of the fourth sensor is configured to sense a third component of the magnetic field, the first, second, and third components of the magnetic field being different from each other.

13. The integrated circuit sensor system of claim 12, wherein the first component of the magnetic field is orthogonal to the second component of the magnetic field, and the third component of the magnetic field is orthogonal to both the first and the second components of the magnetic field.

14. The integrated circuit sensor system of claim 1, further comprising:
a first multiplexer in the first signal channel;
a first analog-to-digital converter (ADC) in the first signal channel and coupled to the first multiplexer;
a second multiplexer in a second signal channel; and
a second analog-to-digital converter (ADC) in the second signal channel and coupled to the second multiplexer, wherein:
the first sensor is coupled to the first ADC via the first multiplexer; and
the second sensor is coupled to the first ADC and the second ADC via the first and the second multiplexers, respectively.

15. The integrated circuit sensor system of claim 14, wherein the third sensor is coupled to the first ADC via the first multiplexer.

16. The integrated circuit sensor system of claim 15, further comprising a fourth sensor that is coupled to the second ADC via the second multiplexer, the fourth sensor being configured to sense the first physical characteristic.

17. The integrated circuit sensor system of claim 14, further comprising a fourth sensor that is coupled to the second ADC via the second multiplexer, the fourth sensor being configured to sense the first physical characteristic.

18. An integrated circuit sensor system comprising:
a first sensor coupled to a first signal channel and configured to sense a first component of a first physical characteristic;
a second sensor coupled to a second signal channel different from the first signal channel, the second sensor being configured to sense a second component of the first physical characteristic;
a third sensor coupled to the first signal channel and the second signal channel, the third sensor being configured to sense a third component of the first physical characteristic;
a fourth sensor coupled to the first signal channel and configured to sense a second physical characteristic different from the first physical characteristic; and
circuitry coupled to the first and the second signal channels and configured to:
provide the respective signals from the first, the second, the third, and the fourth sensors to an external controller configured to perform a signal plausibility check on the sensor system based on the signal from the third sensor, the signal from the fourth sensor, or both the signals from the third and the fourth sensors.

19. The integrated circuit sensor system of claim 18, wherein, based on the signal from the fourth sensor, the circuitry is further configured to compensate:
the signal from the first sensor,
the signal from the second sensor,
the signal from the third sensor, or
a combination of two or more of the respective signals from the first, the second, and the third sensors.

20. The integrated circuit sensor system of claim 18, wherein the circuitry is further configured to detect an error associated with the sensing of the first or the second physical characteristics based on a comparison of signals between the first and second signal channels.

* * * * *